United States Patent
Bunyer et al.

(10) Patent No.: US 7,261,005 B2
(45) Date of Patent: Aug. 28, 2007

(54) MAGNETO-ELASTIC RESONATOR TORQUE SENSOR

(75) Inventors: Scott L. Bunyer, Freeport, IL (US); Richard M. Andrews, Freeport, IL (US); Fred W. Hintz, Freeport, IL (US); James ZT Liu, Hudson, NH (US); Steven J. Magee, Lena, IL (US)

(73) Assignee: Honeywell International Inc., Morristown, NJ (US)

( * ) Notice: Subject to any disclaimer, the term of this patent is extended or adjusted under 35 U.S.C. 154(b) by 147 days.

(21) Appl. No.: 11/203,327

(22) Filed: Aug. 11, 2005

(65) Prior Publication Data

US 2007/0034022 A1    Feb. 15, 2007

(51) Int. Cl.
    *G01L 3/00* (2006.01)
(52) U.S. Cl. ............ 73/862.333; 73/722; 73/728; 73/775; 73/779; 73/862.69
(58) Field of Classification Search ......... 73/722, 73/728, 775, 779, 862.333, 862.69
See application file for complete search history.

(56) References Cited

U.S. PATENT DOCUMENTS

| | | | |
|---|---|---|---|
| 5,297,439 A | 3/1994 | Tyren et al. .................. 73/779 |
| 6,330,833 B1 | 12/2001 | Opie et al. ............ 73/862.333 |
| 6,393,921 B1 | 5/2002 | Grimes et al. |
| 6,598,491 B2 | 7/2003 | Opie et al. ............ 73/862.333 |
| 6,688,162 B2 * | 2/2004 | Bachas et al. ............. 73/64.42 |
| 6,698,299 B2 | 3/2004 | Cripe .................... 73/862.333 |
| 6,758,105 B2 | 7/2004 | Viola et al. .............. 73/862.08 |
| 6,823,746 B2 | 11/2004 | Viola et al. ............ 73/862.335 |
| 6,865,959 B2 | 3/2005 | Kilmartin et al. ...... 73/862.333 |
| 2004/0099064 A1 | 5/2004 | Viola et al. .................. 73/862 |

FOREIGN PATENT DOCUMENTS

FR    2 700 846 A    7/1994
WO   WO 91/00494 A   1/1991

OTHER PUBLICATIONS

K. Zeng, K.G. Ong, C. Mungle, C.A. Grimes; *Time Domain Characterization of Oscillating Sensors: Application of Frequency Counting to Resonance Frequency Determination* Review of Scientific Instruments; vol. 73, No. 12, Dec. 2002.

C.A. Grimes, K.G. Ong, K. Loiselle, P.G. Stoyanov, D. Kouzoudis, Y. Liu, C. Tong, F. Tefiku; *Magnetoelastic Sensors for Remote Query Environmental Monitoring* Smart Mater. Struct. 8 (1999) p. 639-646.

D. Kouzoudis, C.A. Grimes; *The Frequency Response of Magnetoelastic Sensors to Stress and Atmospheric Pressure* Smart Mater. Struct. 9 (2000) pp. 1-5.

* cited by examiner

*Primary Examiner*—Edward Lefkowitz
*Assistant Examiner*—Freddie Kirkland, III
(74) *Attorney, Agent, or Firm*—Kermit D. Lopez; Luis M. Ortiz

(57) ABSTRACT

A magneto-elastic torque sensor and system include a substrate and a magneto-elastic sensing component formed from or on the substrate. The magneto-elastic sensing component and the substrate together form a magneto-elastic torque sensor, which when subject to a stress associated with a torque, shifts a characteristic frequency thereof linearly in response to the torque, thereby inducing a pathway by which magneto-elastic energy is coupled to excite vibrations in a basal plane of the magneto-elastic sensor, thereby generating torque-based information based on a resonant frequency thereof.

14 Claims, 3 Drawing Sheets

MAGNETO-ELASTIC RESONATOR TORQUE SENSOR

TECHNICAL FIELD

Embodiments are generally related to sensing devices and components thereof. Embodiments are also related to torque sensors and magneto-elastic resonators. Embodiments are further related to wireless and passive torque sensors.

BACKGROUND OF THE INVENTION

Magnetostriction is the phenomena whereby a material changed shape (i.e., dimensions) in the presence of an external magnetic field. This effect is brought about by the reordering of the magnetic dipoles within the material. Since the atoms in a magnetostrictive material are not, for all practical purposes, perfectly spherical (they're shaped more like tiny ellipsoids) the reordering of the dipoles causes an elongation (or contraction depending on the mode of reorientation) of the lattice which leads to a macroscopic shape change in the material. There is a "reverse magnetostrictive effect", called the Villari effect: When an external stress is applied to a magnetostrictive material, a strain develops within the material which induces a surrounding magnetic field. Known magnetostrictive materials include alloys of iron (Fe), Nickel (Ni), cobalt (Co), yttrium (Y), gadolinium (Gd), terbium (Tb), dysprosium (Dy), and so on.

The so-called magneto-elastic effect is a phenomenon exhibited by ferromagnetic substances. It refers to the interdependence of the state of magnetization and the amount of mechanical strain present in the material and manifests as magnetostriction, volume change upon magnetization and, inversely, changes in the state of magnetization upon application of stress. When a sample of magnetostrictive material is subjected to an applied small time-varying (AC) magnetic field superimposed on a much larger direct-current (DC) magnetic field, the magnetic energy is translated into elastic energy and the sample starts vibrating.

The mechanical vibrations are most pronounced as the frequency of the applied AC field gets closer to the characteristic resonant frequency $f_0$ of the magnetostrictive sample and a voltage peak for emissions radiating from the sample can be registered by a pick-up coil in proximity thereto. This pronounced conversion from magnetic to elastic energy holds true at harmonics of resonant frequency $f_0$ This condition is known as magneto-elastic resonance. One example of magnetostriction is the "transformer hum" we hear when a transformer core "pulsates" upon the application of a 60 Hz magnetic field, i.e., the 'hum' is the emission of acoustic energy that generates sound.

When measuring mechanical stress, strain or force, it is known to make use of measuring sensors based on magneto-elastic material. Magneto-elastic material has the advantage that it enables contactless signal transmission from a magneto-elastic sensor element to an electronic unit for evaluation of the signal from the sensor element. The relative permeability of a magneto-elastic element depends on the mechanical stress to which the element is subjected, e.g. by a strain within the surface on which it is mounted. During this process, signal scanning can be achieved with the aid of a coil system, the inductance of which is influenced by the permeability of the magneto-elastic element.

An important application area for magneto-elastic sensors is torque measurement on rotating shafts. A primary technique is currently utilized to measure strain and involves the use of torque sensing devices based on the torque-induced changes in the magnetization load-bearing element of the shaft. One can thus measure a flux decrease or increase using this technology. This methodology, however, is subject to high hysteresis results, and is also sensitive to ambient interference and costs a great deal with respect to other sensor technologies, such as, for example Surface Acoustic Wave (SAW) applications.

It is therefore believed that a solution to the aforementioned problems involves the implementation of an improved torque sensor device based on the use of magneto-elastic components. Such an improved sensor device is disclosed in greater detail herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved sensing device.

It is another aspect of the present invention to provide for an improved torque sensor.

It is yet another aspect of the present invention to provide for a magneto-elastic torque sensor and system.

The aforementioned aspects and other objectives and advantages can now be achieved as described herein. A magneto-elastic torque sensor and system are disclosed. In general, a substrate can be provided and a magneto-elastic sensing component formed from or on the substrate. The magneto-elastic sensing component and the substrate together form a magneto-elastic torque sensor, which when subject to a stress associated with a torque, shifts a characteristic frequency thereof linearly in response to the torque, thereby inducing a pathway by which magneto-elastic energy is coupled to excite vibrations in a basal plane of the magneto-elastic sensor, thereby generating torque-based information based on a resonant frequency thereof.

The magneto-elastic sensing component functions as a magneto-elastic resonator. Additionally, a pick-up coil can be provided, which remotely detects a magnetic flux from the magneto-elastic torque sensor as the magneto-elastic torque sensor mechanically deforms in response to the stress. Also, a drive coil can be utilized to offset the magnetic anisotropy associated with the magneto-elastic sensing component in order to enhance the magneto-elastic property of the magneto-elastic torque sensor. The magneto-elastic sensing component can be configured from an amorphous metallic material, such as anamorphous metallic glass ribbon, including for example, $Fe_{40}Ni_{40}P_{14}B_{16}$. In general, the magneto-elastic component and its associated substrate can be connected to a shaft that is subject to torque.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
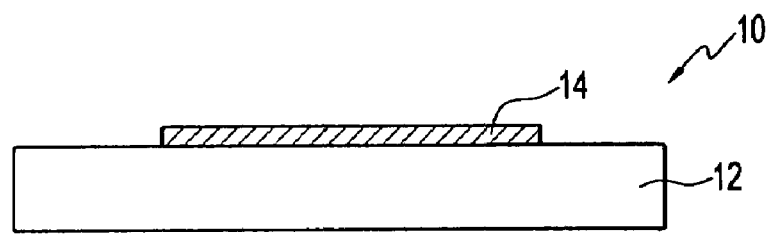
FIG. 1 illustrates a side sectional view of a magneto-elastic torque sensor, which can be implemented in accordance with a preferred embodiment.
Figure 2:
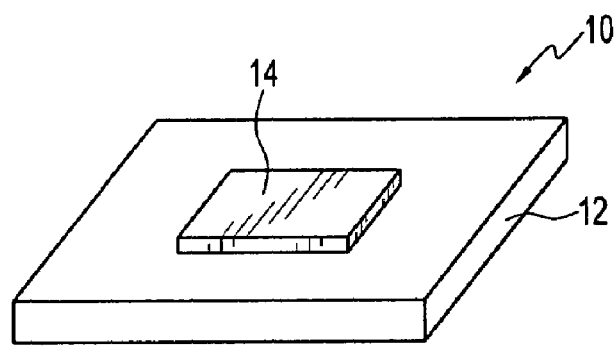
FIG. 2 illustrates a perspective view of the magneto-elastic torque sensor depicted in FIG. 1, in accordance with a preferred embodiment.

FIG. 1 illustrates a side sectional view of a magneto-elastic torque sensor 10, which can be implemented in accordance with a preferred embodiment. FIG. 2 illustrates a perspective view of the magneto-elastic torque sensor 10 depicted in FIG. 1, in accordance with a preferred embodiment. Note that in FIGS. 1-4, identical or similar parts or elements are generally indicated by identical reference numerals. The magneto-elastic torque sensor 10 can be formed from a substrate 12. Note that the substrate 12 can be formed from any number of amorphous metallic materials. Substrate 12 can be based, for example, on iron and/or nickel based alloys. The substrate itself is configured to form the magneto-elastic sensing component 14. A magneto-elastic sensing component 14 is generally configured on or from the substrate 12, depending upon design considerations. Magneto-elastic torque sensor 10 functions based on its resonant frequency, which can change in response to a stress, such as that provided by torque.

Magneto-elastic torque sensor 10 can be thought of, for example, as analogous to an acoustic bell. That is, in response to an externally applied magnetic field impulse, the magneto-elastic sensor essentially "rings" in a bell-like manner, emitting magnetic flux with a characteristic resonant frequency. The basis for this is that the magneto-elastic film (i.e., thin or thick) utilized to form the magneto-elastic component 14, can efficiently convert magnetic energy into elastic energy, which acts to mechanically deform magneto-elastic torque sensor 10. The deformation is greatest at the mechanical resonant frequency of magneto-elastic torque sensor 10.

Because magneto-elastic torque sensor 10 is also magnetostrictive, as the magneto-elastic torque sensor 10 deforms, it generates magnetic flux that can be detected remotely by a pick-up coil. The magnetism-based remote query nature of magneto-elastic torque sensor 10 allows monitoring from inside, for example, sealed containers. Depending upon the desired application and operational frequency range selected, magneto-elastic torque sensor 10 can be sized from micro-meter to centimeter dimensional scales, and can be implemented on a disposable basis if desired.

Figure 3:
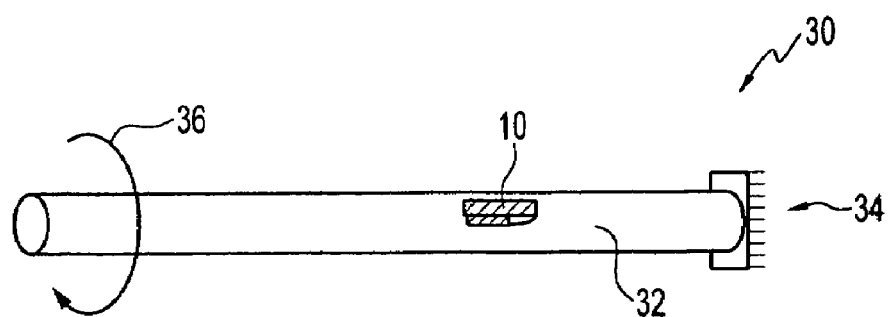
FIG. 3 illustrates a perspective view of a magneto-elastic torque sensing system, which can be implemented in accordance with a preferred embodiment.

FIG. 3 illustrates a perspective view of a magneto-elastic torque sensing system 30, which can be implemented in accordance with a preferred embodiment. The magneto-elastic torque sensing system 30 includes the magneto-elastic torque sensor 10 depicted in FIGS. 1-2, along with a shaft 32, which includes a fixed end 34 thereof that may be mounted to a component, such as an automotive component in a vehicle. The shaft 32 can be subject to a twist or torque 36. The magneto-elastic torque sensor 10 can be connected directly to the shaft 32. The magneto-elastic torque sensor 10 functions as a resonator sensor.

The characteristic resonant frequency of the stressed magneto-elastic torque sensor 10 (i.e., when the shaft experiences torque 36) will shift linearly in response to torque 36. The stress experienced by the magneto-elastic torque sensor 10 introduces a pathway by magneto-elastic energy coupled to the basal plane of magneto-elastic torque sensor 10, inducing the magneto-elastic torque sensor 10 to function as a membrane or drumhead. These large surface-area vibrations efficiently couple with torque 36, acting like an energy loss mechanism lowering the resonant frequency of magneto-elastic torque sensor 10.

Figure 4:
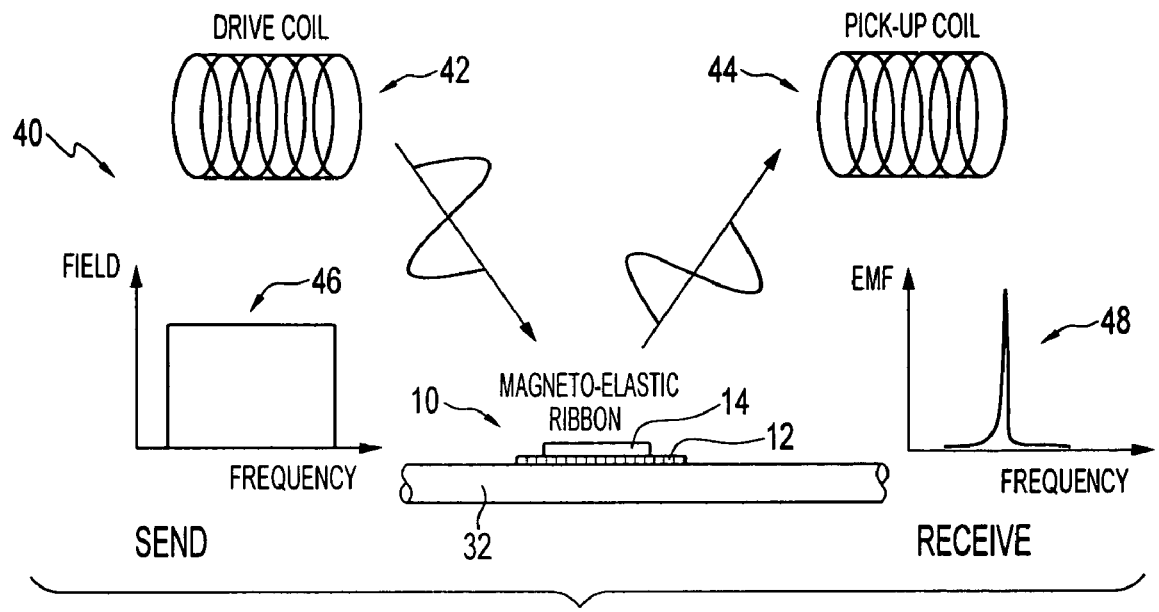
FIG. 4 illustrates a magneto-elastic torque sensing system, which can be implemented in accordance with an alternative embodiment.

FIG. 4 illustrates a magneto-elastic torque sensing system 40, which can be implemented in accordance with an alternative embodiment. The torque sensing system 40 depicted in FIG. 4 generally includes the shaft 32 and the magneto-elastic torque sensor 10 depicted in FIGS. 1-3. The magneto-elastic sensing component 14 can be implemented as a magneto-elastic ribbon.

An example of a ribbon-like sensing component, which can be adapted for use in accordance with magneto-elastic torque sensor 10 is Metglas™ alloy 2826MB produced by Honeywell International Inc. It can be appreciated that such an alloy is referenced herein for illustrative purposes only and that various other types of materials and/or alloys can be utilized for implementing the magneto-elastic torque sensor 10 and specifically, the magneto-elastic sensing component 14 formed on substrate 12.

In the configuration of system 40 frequency versus magnetic field is represented graphically by schematic graph 46, while EMF versus frequency is schematically illustrated by graph 48. A drive coil 42 and a pickup coil 44 are also depicted in FIG. 4. Thus, as the magneto-elastic torque sensor 10 mechanically deforms, it generates magnetic flux that can be detected by the pick-up coil 44. The drive coil 42 can also be utilized to detect such magnetic flux, depending upon design considerations. System 40 thus demonstrates the remote query nature of magneto-elastic torque sensor 10.

Graphs 46 and 48 indicate how system 40 operates based on the excitation of longitudinal elastic standing waves by an AC magnetic field at the mechanical resonance frequency. Note that a superimposed direct current (DC) magnetic field can be utilized to effectively offset magnetic anisotropy associated with the magneto-elastic sensing component 14, thereby enhancing the magneto-elastic properties of the magneto-elastic torque sensor 10. This DC field can be supplied a field coil, or by adjacent placement of a magnetically hardened piece of material. Drive coil 42 can function as a field coil, depending upon design considerations and goals.

Figure 5:
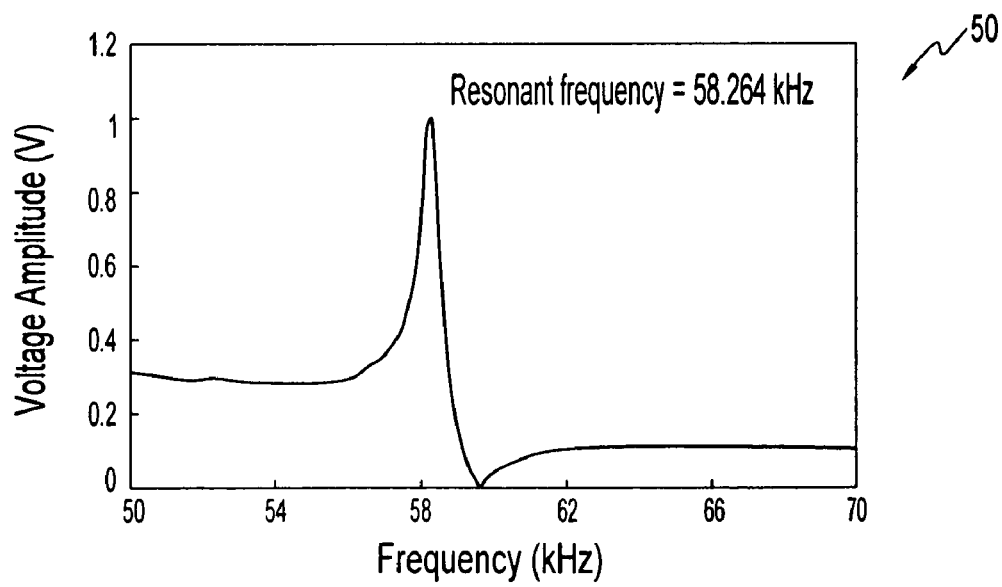
FIG. 5 illustrates a graph illustrating the response of a magneto-elastic component in air, in accordance with an alternative embodiment.

FIG. 5 illustrates a graph 50 illustrating the response of a magneto-elastic component in air, in accordance with an alternative embodiment. In general, if the frequency of the AC field is equivalent to the frequency of the mechanical resonance of the magneto-elastic torque sensor 10, the conversion of the magnetic energy into elastic energy is at a maximum value and the sensor can experience a magneto-elastic resonance. Assuming that the magneto-elastic sensing component 14 is implemented as a think, ribbon-like strip of length L vibrating in the past plane of the magneto-elastic torque sensor 10, the resonant frequency can be calculated as follows, based on equation (1) below:

$$f_n = \sqrt{\frac{E}{\rho(1-\sigma^2)} \frac{n\pi}{L}}, \text{ where } n = 1, 2, 3, \ldots \quad (1)$$

In equation (1), for example, the value E represents Young's modulus of elasticity, and the value σ represents the Poisson ratio. Additionally, the variable ρ represents the density of the sample, L represents the length of the magneto-elastic sensing component or ribbon 12 connected to the shaft 32, and the variable n denotes integers. Graph 50 depicted in FIG. 5 thus demonstrates the frequency-dependent response of a 30 mm×3 mm×30 μm $Fe_{40}Ni_{40}P_{14}B_{16}$ Metglas™ sensing component, which can be measured at room temperature and one atmosphere pressure. It can be appreciated that graph 50 is provided for general illustrative purposes only and is not considered to be a limiting feature of the embodiments.

Figure 6:
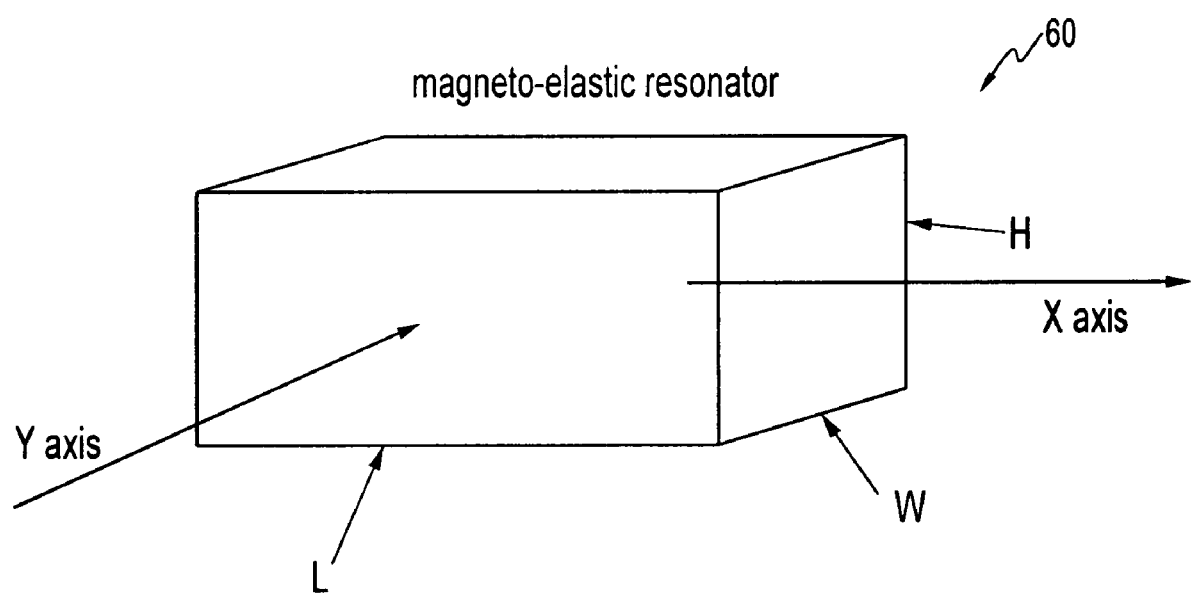
FIG. 6 illustrates a pictorial representation of a magneto-elastic resonator, in accordance with an embodiment.

FIG. 6 illustrates a pictorial representation of a magneto-elastic resonator 60, which can be adapted for use in accordance with the embodiments disclosed herein. The magneto-elastic resonator 60 can be utilized in place of, for example, or in association with the magneto-elastic torque sensor 10 described earlier. In the configuration depicted in FIG. 6, assume that the L-W side of the magneto-elastic resonator 60 is attached to the metal shaft 32 depicted earlier. When magnetic flux is in the X axis, frequency is related to L based on equation (1).

When magnetic flux is applied in the Y axis, frequency is related to W. When two sets of frequency data are measured, such measured data can be adapted for use in temperature compensation. When temperature increases, L and W both increase. When stress in the X direction increases, L increase while W decrease. This would avoid using a second sensor and/or the necessity of incorporating another type of sensor, such as, for example, a temperature sensor.

Thus, the configuration of FIG. 6 can be utilized along with the embodiments disclosed in FIGS. 1-5 to configure a magneto-elastic torque sensing system that includes a substrate 12 and a magneto-elastic sensing component 14 formed on the substrate 12, wherein the magneto-elastic sensing component 14 comprises a magneto-elastic resonator such as, for example, resonator 60 illustrated in FIG. 6. The magneto-elastic sensing component 14 or 60 and the substrate from the magneto-elastic torque sensor 10. Shaft 32, can be provided upon which the magneto-elastic torque sensor 10 is connected, such that when the magneto-elastic torque sensor 10 is subject to a stress associated with a torque 36 induced in the shaft 32. A characteristic frequency associated with the magneto-elastic torque sensor 10 shifts linearly in response to the torque 32, thereby inducing a pathway by which magneto-elastic energy is coupled to excite vibrations in a basal plane of the magneto-elastic sensor 10, thereby generating torque-based information based on a resonant frequency thereof.

A pick-up coil can also be provided (i.e., in addition to the previously described pick-up coil) that remotely detects the magnetic flux from the magneto-elastic torque sensor 10 from a different axis as the magneto-elastic torque sensor 10 mechanically deforms in response to the stress. A drive coil 42 can also be utilized to offset the magnetic anisotropy associated with the magneto-elastic sensing component in order to enhance a magneto-elastic property of the magneto-elastic torque sensor 10. The measurement of the different axis measurement can be utilized to obtain a set of frequency data related to the magneto-elastic torque sensor 10. Such a measurement of the different axis can also be utilized for temperature compensation and/or for higher precision operations.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A magneto-elastic torque sensor, comprising:
   a substrate; and
   a magneto-elastic sensing component formed on said substrate, wherein said magneto-elastic sensing component and said substrate form a magneto-elastic torque sensor, which when subject to a stress associated with a torque, shifts a characteristic frequency thereof linearly in response to said torque, thereby inducing a pathway by which magneto-elastic energy is coupled to excite vibrations in a basal plane of said magneto-elastic sensor, thereby generating torque-based information based on a resonant frequency thereof and wherein said magneto-elastic sensing component comprises a nickel based alloy.

2. The sensor of claim 1 wherein said magneto-elastic sensing component comprises a magneto-elastic resonator.

3. The sensor of claim 1, further comprising a pick-up coil that remotely detects a magnetic flux from said magneto-elastic torque sensor as said magneto-elastic torque sensor mechanically deforms in response to said stress.

4. The sensor of claim 1 further comprising a drive coil utilized to offset a magnetic anisotropy associated with said magneto-elastic sensing component in order to enhance a magneto-elastic property of said magneto-elastic torque sensor.

5. The sensor of claim 1 wherein said magneto-elastic component is connected to a shaft that is subject to said torque.

6. The system of claim 1 wherein said magneto-elastic sensing component comprises a magneto-elastic ribbon.

7. The system of claim 2 wherein said magneto-elastic resonator comprises a magneto-elastic ribbon.

8. A magneto-elastic torque sensing system, comprising:
   a substrate;
   a magneto-elastic sensing component formed on said substrate, wherein said magneto-elastic sensing component comprises a magneto-elastic resonator, wherein said magneto-elastic sensing component and said substrate form a magneto-elastic torque sensor,
   a shaft upon which said magneto-elastic torque sensor is connected, such that when said magneto-elastic torque sensor is subject to a stress associated with a torque induced in said shaft, a characteristic frequency associated with said magneto-elastic torque sensor shifts linearly in response to said torque, thereby inducing a pathway by which magneto-elastic energy is coupled to excite vibrations in a basal plane of said magneto-elastic sensor, thereby generating torque-based information based on a resonant frequency thereof;
   a pick-up coil that remotely detects a magnetic flux from said magneto-elastic torque sensor as said magneto-elastic torque sensor mechanically deforms in response to said stress; and a drive coil utilized to offset a magnetic anisotropy associated with said magneto-elastic sensing component in order to enhance a magneto-elastic property of said magneto-elastic torque sensor and wherein said magneto-elastic sensing component comprises an amorphous metallic material, said amorphous metallic material comprising $Fe_{40}Ni_{40}P_{14}B_{16}$.

9. The system of claim 8 wherein said magneto-elastic sensing component comprises a magneto elastic ribbon.

10. A magneto-elastic torque sensing system, comprising:
a substrate;
a magneto-elastic sensing component formed on said substrate, wherein said magneto-elastic sensing component comprises a magneto-elastic resonator, wherein said magneto-elastic sensing component and said substrate form a magneto-elastic torque sensor,
a shaft upon which said magneto-elastic torque sensor is connected, such that when said magneto-elastic torque sensor is subject to a stress associated with a torque induced in said shaft, a characteristic frequency associated with said magneto-elastic torque sensor shifts linearly in response to said torque, thereby inducing a pathway by which magneto-elastic energy is coupled to excite vibrations in a basal plane of said magneto-elastic sensor, thereby generating torque-based information based on a resonant frequency thereof;
a pick-up coil that remotely detects a magnetic flux from said magneto-elastic torque sensor from a different axis as said magneto-elastic torque sensor mechanically deforms in response to said stress; and
a drive coil utilized to offset a magnetic anisotropy associated with said magneto-elastic sensing component in order to enhance a magneto-elastic property of said magneto-elastic torque sensor and wherein measurement of said different axis is utilized for temperature compensation.

11. The system of claim 10 wherein a measurement of said different axis measurement is utilized to obtain a set of frequency data related to said magneto-elastic torque sensor.

12. The system of claim 11 wherein said magneto-elastic sensing component comprises a magneto-elastic ribbon.

13. The system of claim 10 wherein a measurement of said different axis is utilized for higher precision.

14. The system of claim 10 wherein said magneto-elastic sensing component comprises a magneto-elastic ribbon.

* * * * *